United States Patent
Overweg et al.

(10) Patent No.: US 6,618,606 B2
(45) Date of Patent: Sep. 9, 2003

(54) VERTICAL FIELD TYPE MRI APPARATUS WITH A CONICAL GRADIENT COIL SITUATED IN THE MAIN MAGNET

(75) Inventors: Johannes Adrianus Overweg, Uelzen (DE); Bernd Aldefeld, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/962,654

(22) Filed: Sep. 25, 2001

(65) Prior Publication Data

US 2002/0072666 A1 Jun. 13, 2002

(30) Foreign Application Priority Data

Sep. 26, 2000 (EP) ............................................. 00203323

(51) Int. Cl.[7] ............................................... A61B 5/055
(52) U.S. Cl. ...................................... 600/410; 324/318
(58) Field of Search ................................ 600/410, 422; 324/307, 309, 318, 322

(56) References Cited

U.S. PATENT DOCUMENTS

| | | | | |
|---|---|---|---|---|
| 5,512,828 A | * | 4/1996 | Pausch et al. | 324/309 |
| 5,892,359 A | * | 4/1999 | Yui et al. | 324/318 |
| 5,917,395 A | | 6/1999 | Overweg | 335/296 |
| 5,939,962 A | | 8/1999 | Tahara et al. | 335/216 |
| 2002/0072666 A1 | * | 6/2002 | Overweg et al. | 600/410 |

FOREIGN PATENT DOCUMENTS

EP    0807940 A1    11/1997

OTHER PUBLICATIONS

Patent Abstracts of Japan, Takeshima Hirotaka, "Gradient Magnetic Field Coil And Magnetic Resonance Imaging Apparatus Using The Same," Publication No. 09262223m Jul. 10, 1997, Application No. 08099670, Mar. 29, 1996.
Morgan et al., "Open Access Conical Magnets for MRI," Apr. 27–May 3, 1996, p. 1399.

* cited by examiner

Primary Examiner—Ruth S. Smith
(74) Attorney, Agent, or Firm—John Vodopia (57) ABSTRACT

A vertical field type MRI apparatus is provided with a superconducting coil system for generating a substantially homogeneous magnetic field in an imaging volume of the apparatus. The coil system includes a circular outer coil and a supplementary coil which is positioned in the same plane as and within the outer coil, which coils conduct opposite currents. The ratio $D_a/D_o$ of the diameter $D_a$ of the supplementary coil to the diameter $D_o$ of the outer coil lies between 0.7 and 0.9. Further coils for making the field more homogeneous are preferably located on a conical surface within the circular outer coil and supplementary coil in such a manner that a recess is formed in which a conically shaped gradient coil system can be accommodated, with the result that the expensive outer coil and the supplementary coil can be arranged at an as short as possible distance from the space for receiving the patient to be examined.

19 Claims, 6 Drawing Sheets

VERTICAL FIELD TYPE MRI APPARATUS WITH A CONICAL GRADIENT COIL SITUATED IN THE MAIN MAGNET

FIELD OF THE INVENTION

The present invention relates to a vertical field-type MRI apparatus for forming magnetic resonance images, including at least one field generating superconducting coil system for producing a substantially homogeneous magnetic field in an imaging volume of the apparatus, which coil system includes an outer coil that is situated in a flat outer coil plane and a supplementary coil that is situated within the outer coil, and at least one gradient coil system for producing a magnetic gradient field in the imaging volume of the apparatus. The gradient coil system includes a flat main gradient coil and a shielding coil.

BACKGROUND OF THE INVENTION

An apparatus of this kind is known from U.S. Pat. No. 5,939,962. The homogeneous magnetic field required for magnetic resonance imaging in such a vertical field type apparatus is usually generated by two oppositely situated magnetic poles wherebetween the patient to be examined can be arranged. Generally speaking, said magnetic field then has a vertical direction. Apparatus of this kind offer the advantage that the patient keeps a comparatively broad view of the surroundings when arranged in such an apparatus, so that sensations of claustrophobia occur less frequently.

An iron circuit that is capable of transporting the complete flux through the system becomes very heavy in the case of magnet systems having a field strength beyond approximately 0.5 T. A sensible alternative in that case is to omit the iron circuit completely and to construct the magnet system as an actively shielded air coil system. In that case there are no poles in the sense of iron structures that bound the space of the magnet system that is accessible to the patient, but the surfaces of the magnet system that bound the patient space will also be referred to hereinafter as "poles" for the sake of simplicity. For field strengths beyond 0.5 T the coils must be constructed so as to be superconducting. They are kept at the operating temperature in a cryostat. The "poles" are then formed by the outer wall of the vacuum envelope of the cryostat.

The cited United States patent discloses a superconducting coil system which consists of a round outer coil (a so-called "side coil" that is denoted by the reference 12a therein), a round supplementary coil (referred to therein as "the fourth coil" which bears the reference 12d), and a number of further coils (referred to as "the second and the third coils" bearing the references 12b and 12c therein). The homogeneous field in the imaging volume is generated mainly by the first two coils 12a and 12d and the other coils mentioned superpose a further homogenizing field thereon.

As is generally known, and also described in the cited United States patent, for this type of apparatus the aim is to arrange the field generating coil in the upper magnetic pole at an as short as possible distance from the field generating coil in the lower magnetic pole. This aim stems from the fact that the production costs of such a system increase by approximately a power of five of said pole distance, so that it is advantageous to keep this distance as small as possible. Because of this aim, the outer coils in the known apparatus are arranged practically directly against the boundary of the freely accessible space between the magnetic poles.

When the outer coils are mounted in that manner, the gradient coils in the known apparatus must extend to practically the diameter of the associated outer coils because of the necessary linearity of the gradient field in the imaging volume. Consequently, room for the supplementary coil (also having a voluminous and heavy construction so as to achieve the required homogeneous field) can be found only above the upper gradient coil and below the lower gradient coil. Consequently, the construction of this already bulky and heavy coil must be even larger; however, the outer coil must then also become larger. Moreover, in the case of actively shielded magnetic coils the shielding coils must then also become larger. The ultimate effect of the foregoing is that the costs of the apparatus are significantly increased again.

OBJECTS AND SUMMARY OF THE INVENTION

It is an object of the present invention to provide a vertical field-type MRI apparatus in which the distance between the outer coils and between the supplementary coils is as small as possible. To achieve this object and others, in the apparatus in accordance with the invention, the supplementary coil is situated in the outer coil plane, the energizing of the outer coil and the supplementary coil is such that these coils generate magnetic fields of opposite direction, the ratio $D_a/D_o$ of the diameter $D_a$ of the supplementary coil to the diameter $D_o$ of the outer coil is between 0.7 and 0.9, the apex of the shielding coil of the gradient coil system is situated at a distance from the main gradient coil which is larger than the distance between the edge of the shielding coil and the main gradient coil, and the gradient coil system is situated at least partly in a space within the supplementary coil.

The invention is based on the recognition of the fact that the minimum distance between the field-generating poles can be realized by imparting a special shape to the shielding coil of the gradient coil system, that is, a shape such that the center or apex of the shielding coil is situated at a distance from the main gradient coil which is larger than the distance from the edge of the shielding coil to the main gradient coil. The shape of the shielding coil is thus substantially conical. As a result of the shape of the gradient coil system, the supplementary coil which is energized in an opposite sense or direction relative to the outer coil can be situated in the same plane (the outer coil plane) as the outer coil. This yields a suitably homogeneous field in the imaging volume if the ratio $D_a/D_o$ of the diameter $D_a$ of the supplementary coil to the diameter $D_o$ of the outer coil is between 0.7 and 0.9. A space still remains in the supplementary coil so as to accommodate the gradient coil system thus formed.

Said special shape of the gradient coil system also yields an additional advantage is obtained. This is because it has been found that said system can be proportioned in such a manner that a slit-like space remains between the shielding coil of the system and a corresponding recess in the cryo container of the coil system that generates the homogeneous field. This space can be used to accommodate the so-called shim iron which is used in known manner so as to compensate changes of the magnetic environment, that is, to compensate circumstances degrading the homogeneity. Periodic adaptations of the shim state are necessary and to this end the shim iron is then readily accessible and can be displaced without it being necessary to remove the entire system of gradient coils. This advantage is due to a generally non-angular profile of said special shape of the shielding coil.

The shielding coil in a preferred embodiment of the invention extends across a substantially conical surface. This conical shape is then taken up in said free space within the supplementary coil and the flat main gradient coil is then situated substantially in the outer coil plane.

An advantageous embodiment of the apparatus in accordance with the invention is provided with three further coils, each of which is situated in a respective further coil plane, the outer coil plane being situated between the imaging volume and each of said further coil planes It has been found that a suitable compromise can thus be achieved between production costs (condition: few and small further coils) and field strength and homogeneity (condition: many and large further coils).

In a further advantageous embodiment in accordance with the invention the three further coils are situated on a conical surface, the apex of the conical surface being directed away from the imaging volume.

Apart from the fact that this configuration very well satisfies the requirements as regards field strength and homogeneity, this embodiment notably offers the advantage that there is created an inner space (that is, a space around the vertical axis of the imaging volume) which, because of its conical shape, is very compatible with a gradient coil having a conical external appearance. This shape of a cavity in the magnetic pole, that is, in the cryo container of the magnetic coils, also has an additional advantage. In normal operating conditions the cooling medium present in a cryo container, that is, liquid helium, has a pressure of approximately 1 bar. In given circumstances, however, this pressure may increase to as much as 3 bar. The helium container is surrounded by a vacuum space which, therefore, lies between the ambient atmosphere and the helium container. In the case of a cavity with square corners, as in the present state of the art, extreme mechanical stresses could occur at said pressures; when a more or less conical cavity is used, such stresses will occur to a much lesser extent because of the gradual shaping of the walls of the container.

A preferred embodiment of the apparatus in accordance with the invention is provided with a second field generating superconducting coil system for producing a substantially homogeneous magnetic field in the imaging volume of the apparatus, which second coil system includes:
- a second outer coil which is situated in a second flat outer coil plane and whose diameter is larger than that of said first outer coil,
- a second supplementary coil which is situated within the second outer coil and in the second outer coil plane,
- which apparatus also includes a second gradient coil system for producing a magnetic gradient field in the imaging volume of the apparatus, said second gradient coil system including a flat main gradient coil and a shielding coil,
- the energizing of the second outer coil and of the second supplementary coil being such that these coils generate magnetic fields of opposite direction,
- the ratio $D_a/D_o$ of the diameter $D_a$ of the second supplementary coil to the diameter $D_o$ of the second outer coil being between 0.7 and 0.9,
- the center of the shielding coil of the second gradient coil system being situated at a distance from the main gradient coil of the second gradient coil system which is larger than the distance between the edge of said shielding coil and the main gradient coil, and
- the second gradient coil system being situated at least partly in a space within the second supplementary coil.

It is feasible to provide the coil system for generating the homogeneous field with only one pole surface; in such apparatus a given concession is made in respect of homogeneity and field strength, but it nevertheless remains possible to use the apparatus for given medical purposes. An apparatus of this kind is known, for example, from U.S. Pat. No. 5,917,395. When the apparatus is constructed so as to have two pole surfaces as is more usual, an attractive location of the imaging volume relative to the pole surfaces can be chosen. This offers an advantage in the following circumstances: a given size of the imaging volume is defined in dependence on the amount of space desired for the patient. This size defines the minimum distance between the pole surfaces. It should be possible to make optimum use of this distance for all imaging purposes, notably the imaging of parts of the body that are situated at a low level in the imaging volume, for example the vertebral column which is situated directly above the table top in the case of a patient in the supine position. This table top, of course, should be as thin as possible as otherwise space that could be used for imaging is lost or the pole surfaces have to be situated further apart again. The vertebral column is then situated at the edge of the imaging volume, so that optimum homogeneity is not possible over a great length. As a result of said steps (notably because the lower outer coil has a diameter which is larger than that of the upper coil), the imaging volume can be lowered relative to the pole surfaces, so that the vertebral column fits better in the imaging volume, without it being necessary to enlarge the latter (which is expensive and leads to a high power consumption during operation).

The second shielding coil in a further embodiment of the invention extends across a substantially conical surface. The conical shape is then taken up in said free space within the second supplementary coil and the flat main gradient coil is then situated substantially in the second outer coil plane.

An advantageous embodiment of the apparatus in accordance with the invention is provided with four further coils, each of which is situated in a respective further coil plane, the second outer coil plane being situated between the imaging volume and each of said further coil planes.

It has been found that said number of further coils enables a suitable compromise to be achieved between production costs, field strength and homogeneity in the case of the desired lowering of the imaging volume.

The four further coils in a further embodiment of the invention are situated on a conical surface, the apex of the conical surface being directed away from the imaging volume.

Thus, a space is created within the coil container for the main field, the conical shape of said space being very well compatible with a gradient coil having a conical external appearance.

BRIEF DESCRIPTION OF THE DRAWINGS

The invention will be described in detail hereinafter with reference to the accompanying drawings in which corresponding reference numerals denote corresponding elements, and wherein.

DETAILED DESCRIPTION OF THE INVENTION

Figure 1:
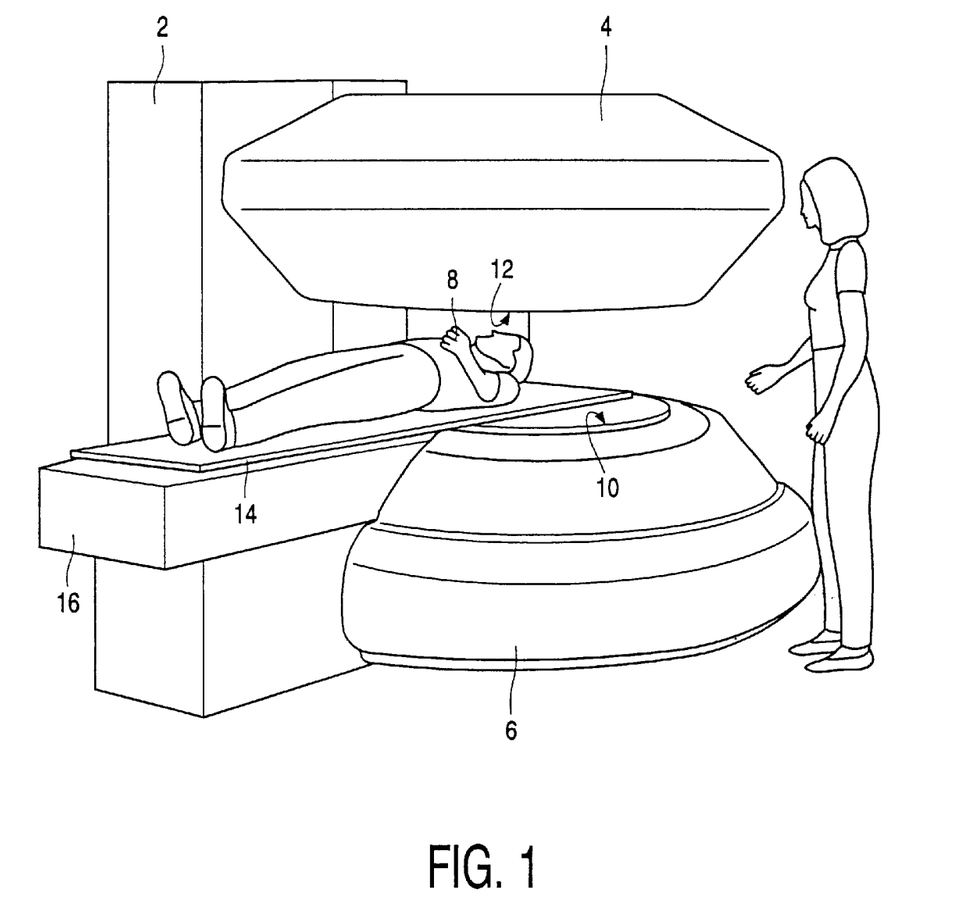
FIG. 1 is a general view of a known apparatus of the vertical field type for the formation of MRI images.

FIG. 1 is a general view of a known vertical field type apparatus for the formation of MRI images. The apparatus consists of a stand 2 which supports a lower magnetic pole 4 and an upper magnetic pole 6. In the present context, a magnetic pole is to be understood to mean the assembly of associated field-generating coils, without it being necessary (but possible) to provide an iron circuit which interconnects the two magnetic poles to conduct the magnetic flux. A space for receiving a patient 8 to be examined is provided between the magnetic poles 4 and 6. The patient 8 to be examined is arranged on a table top 14 supported by a support which forms part of the stand 2 so that the patient can be arranged in the correct position and with the correct orientation between the magnetic poles 4 and 6.

The space for accommodating the patient to be examined in customary MRI apparatus is shaped as a tunnel having a cross-section of the order of magnitude of 60 cm; for many patients, notably for children, this configuration provokes feelings of anxiety and sensations of claustrophobia. The advantage of the constellation of magnetic poles as shown in FIG. 1 resides in the fact that the patient retains a comparatively broad view of the surroundings when arranged in such an apparatus, so that such feelings and sensations are alleviated or even disappear.

At the side of the patient the magnetic poles are bounded by pole surfaces 10 and 12 which are physically formed by the covers of the cryo containers in which the superconducting magnet coils are accommodated. The distance between the pole surfaces is chosen to be such that said uncomfortable sensations are counteracted for the patient, but not so large that the production of the magnetic poles becomes much more expensive. It has been found in practice that a distance of from 50 to 60 cm is a suitable value.

Figure 2:
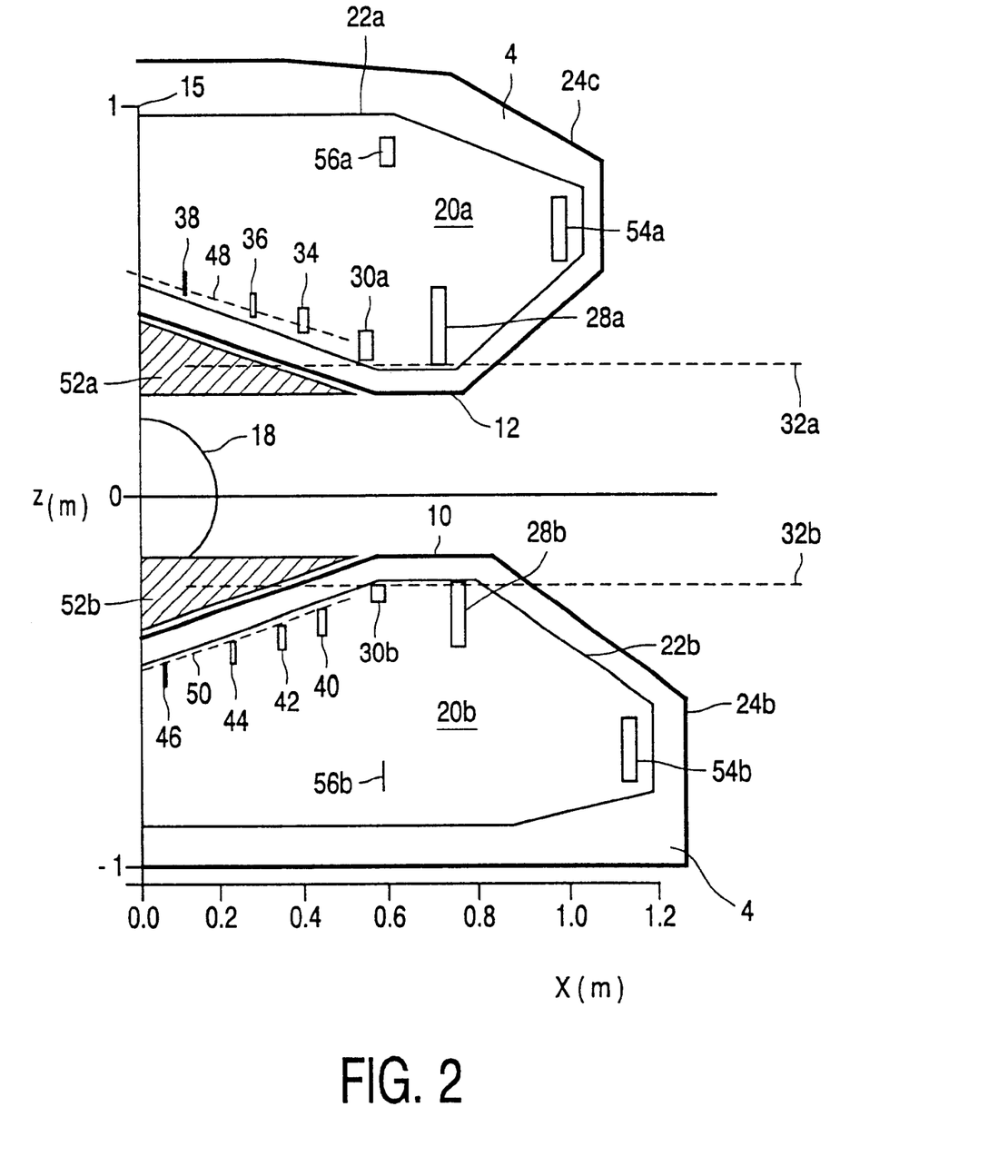
FIG. 2 is a sectional view through the poles, the coil systems in accordance with the invention being accommodated in the cryo containers.

FIG. 2 is a sectional view through the magnetic poles 4 and 6 with the coil systems 20a and 20b in accordance with the invention arranged in the cryo containers. FIG. 2 shows the section of the round coil systems (that is, circular symmetrical systems around a vertical line 15) with the plane of drawing; because of the circular symmetry, FIG. 2 shows only half of the coil systems, but the other half may be assumed to be formed by mirror imaging relative to a plane extending through the line 15 and perpendicularly to the plane of drawing. Between the magnetic poles 4 and 6 there is situated a region 18 in which the field generated by the magnetic poles 4 and 6 is sufficiently homogeneous so as to enable the formation of MRI images. This region 18 is referred to as the imaging volume of the apparatus. Each of the magnetic poles 4 and 6 includes a field-generating superconducting coil system 20a,20b, respectively, for producing a substantially homogeneous magnetic field in the imaging volume 18 of the apparatus. (The coil system 20a is situated in the magnetic pole 4 and the coil system 20b is situated in the magnetic pole 6.) As is customary in the case of superconducting coils, the coil systems 20a,20b are accommodated in a respective helium container 22a,22b which itself is enclosed by a respective outer vacuum container 24a,24b.

Each of the coil systems 20a,20b includes a round outer coil 28a,28b and a round supplementary coil 30a,30b which is situated within the respective outer coil 28a,28b. Both coils are situated in one flat plane, that is, the outer coil plane 32a,32b. The ratio $D_a/D_o$ of the diameter $D_a$ of the supplementary coil 30a,30b to the diameter $D_o$ of the respective outer coil 28a,28b generally lies between 0.7 and 0.9 and equals 0.8 in the present embodiment. In accordance with the invention, the distance between the two outer coils 28a and 28b as well as that between the two supplementary coils 30a and 30b can be minimized in this configuration, meaning that the distance between these coils (ignoring the space for the vacuum space, the covers and the radiation shields that are not shown) is substantially equal to the distance between the pole surfaces 10 and 12. The comparatively high costs of the coils can thus be limited to a minimum.

The upper coil system 20a also includes three further round coils 34, 36 and 38, each of which is situated in a respective further coil plane (not shown). Each of said further coil planes is situated further from the imaging volume than the outer coil plane 32a. In the embodiment shown the further coils 34 to 38 are situated on a conical surface 48 whose section with the plane of drawing is shown, the apex of the conical surface 48 being directed away from the imaging volume, so upwards in the present case.

The lower coil system 20b also includes four further round coils 40, 42, 44 and 46, each of which is situated in a respective further coil plane (not shown). Each of said further coil planes is situated further from the imaging volume 18 than the outer coil plane 32b. In the embodiment shown the further coils 40 to 46 are situated on a conical surface 50 whose section with the plane of drawing is shown, the apex of the conical surface 50 being directed away from the imaging volume, so downwards in the present case.

It holds for both coil systems 20a and 20b that the energizing of the outer coils 28a and 28b is such that they produce a magnetic field of the same direction. The energizing of the supplementary coil 30a opposes that of the outer coil 28a whereas the energizing of the supplementary coil 30b opposes that of the outer coil 28b. The exact arrangement and energizing of the further coils 34 to 46 is aimed at further enhancement of the homogeneity of the magnetic field in the imaging volume 18; the arrangement of these coils has to be such that it enables the formation of a conical cavity in each of the magnetic poles. A gradient coil 52a, 52b can be arranged in each of said cavities, said gradient coils having a flat boundary at the side of the imaging volume and a conical boundary at the side that is remote from the imaging volume.

FIG. 2 shows that the imaging volume 18 is not situated exactly halfway between the pole surfaces 10 and 12 but has been lowered slightly relative to the center. As has already been described, this location of the imaging volume offers given advantages in respect of imaging of, for example the vertebral column. The downward shift of the imaging volume is achieved in that the outer field coil 28*b* of the lower coil system 20 has a diameter which is larger than that of the outer field coil 28*a* of the upper coil system 20*a*; a similar relationship exists between the supplementary coils 30*a* and 30*b*. As a result of these steps, the imaging volume can be lowered relative to the pole surfaces, so that the vertebral column of a patient in the supine position in the imaging volume fits better into the imaging volume so that this volume need not be enlarged.

Each of the coil systems also includes a round outer shielding coil 54*a*, 54*b* and a round inner shielding coil 56*a* and 56*b*, respectively, situated within said outer shielding coils. These coils act in known manner to shield the environment from the magnetic field generated by the magnetic coils.

Figure 3:
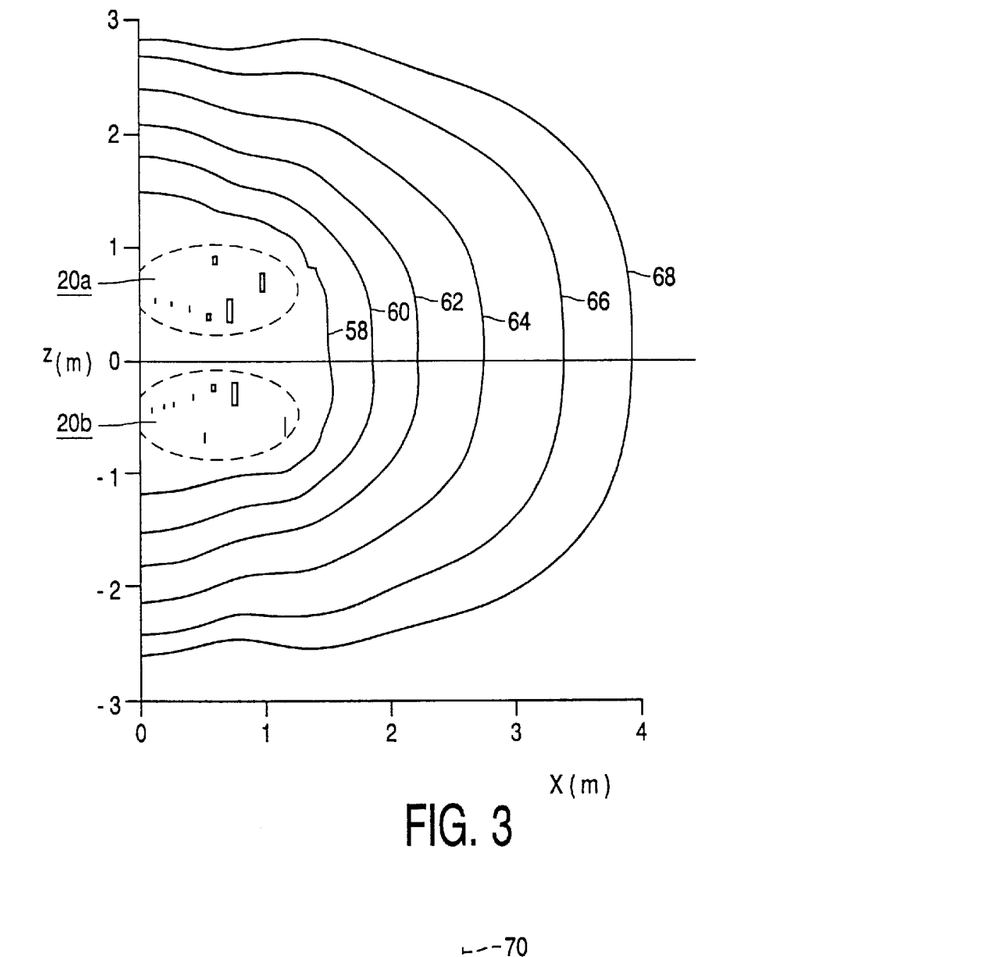
FIG. 3 is a graphic representation of the field variation around the imaging volume of the apparatus in accordance with the invention.

FIG. 3 is a graphic representation of the field geometry around the imaging volume of the apparatus in accordance with the invention. The horizontal distance to the center of the imaging volume 18 is plotted on the horizontal axis (the x axis) and the vertical distance to the center of the imaging volume 18 is plotted on the vertical axis (the z axis). The Figure shows the coil systems 20*a* and 20*b* diagrammatically and to scale. The lines 58, 60, 62, 64, 66 and 68 in this Figure constitute the lines of equal field strength. The field strengths of 10 mT, 3 mT, 1 mT, 0.3 mT, 0.1 mT and 0.05 mT, respectively, are associated with said lines. Thus, it appears from this Figure that the field decays rapidly directly outside the imaging volume and that an increase of the distance from 1.5 m (line 58) to 3.5 m (line 66) causes a field decrease by even a factor of 100.

Figure 4A:
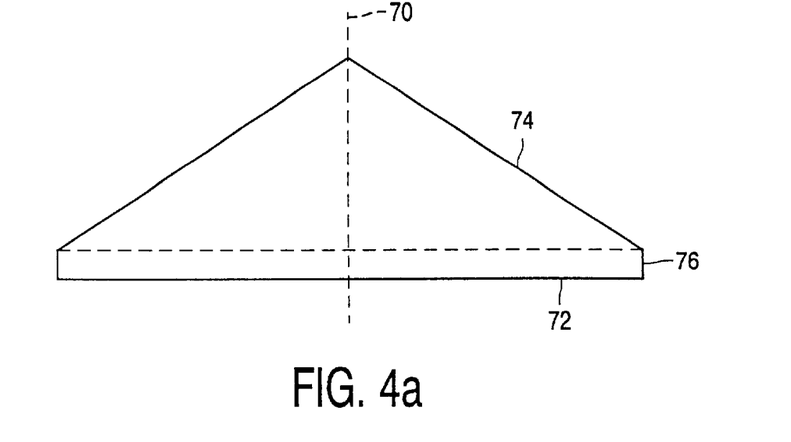
FIG. 4a is a general view of the external appearance of a gradient coil system in accordance with the invention.

FIG. 4*a* shows the overall external appearance of a gradient coil system in accordance with the invention. The gradient coil system consists of a main gradient coil for actually generating the gradient field and a shielding coil for compensating the gradient field as much as possible outside the imaging volume (notably at the area of the metal parts of the main magnet). The main gradient coil is wound in a flat plane whereas the shielding coil extends across a substantially conical surface whose apex is directed away from the imaging volume. This external appearance of a gradient coil can be used for the x gradient coil as well as for the y gradient coil and the z gradient coil. However, the shape of the conductors of the x coil and the y coil deviates from that of the conductors of the z coil. The overall shape of the gradient coil system thus formed is shown in the side elevation of FIG. 4*a* which is rotationally symmetrical around the line 70. The main gradient coil therein is denoted by the reference numeral 72 and the shielding coil is denoted by the reference numeral 74. A cylindrical return conductor (yet to be described) is denoted by the reference numeral 76.

Figure 4B:
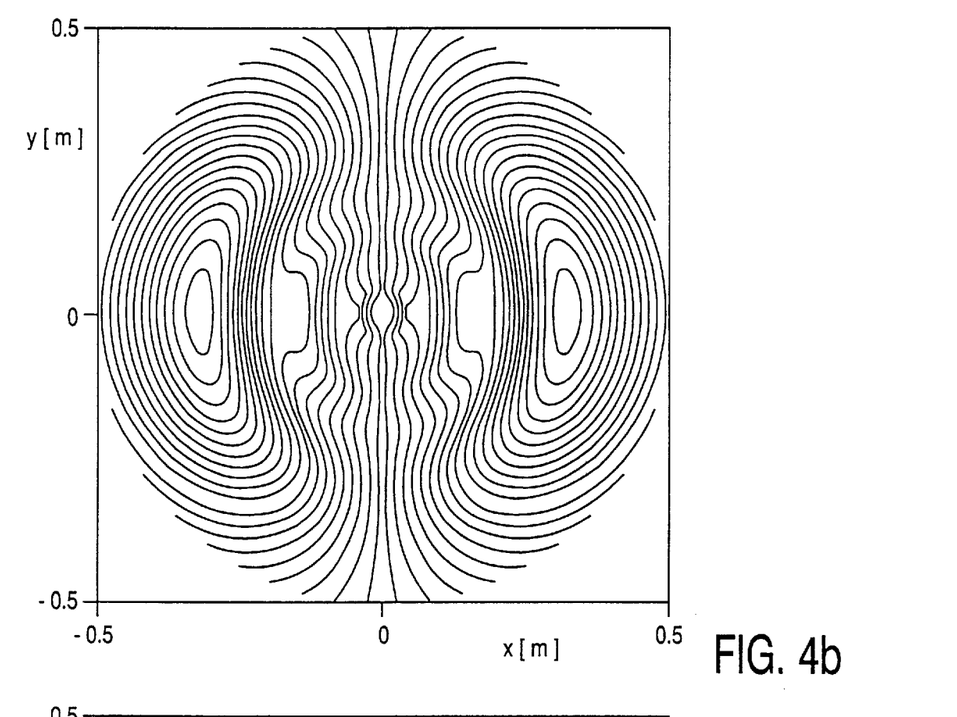
FIG. 4b shows the conductor pattern of the flat x main gradient coil of the gradient coil system in accordance with the invention.

FIG. 4*b* shows the conductor pattern of the flat x main gradient coil of the gradient coil system in accordance with the invention; the x and y coils have the same appearance but are arranged so as to be rotated through 90° relative to one another. These conductors generally have the shape of a number of concentric letters D which, moreover, are mirror imaged relative to one another.

The lines in FIG. 4*b* may constitute the conductors of the gradient current; the conductors must then be considered to be connected in series (not shown in the Figure). However, it is also possible to select a conductor pattern where the strips between the lines in the Figure constitute the conductors, so that in that situation the lines in the Figure constitute the insulation between said strips. In that case the strips are again connected in series in a manner which is not shown in the Figure. The conductors of the x main gradient coil generally have the shape of a system of concentric letters D, said system also being mirror imaged relative to a line to the left of the Ds. A number of conductors that extend through the center of the Figure are not closed in themselves. In order to conduct the return current therethrough, said conductors are connected in series with conductors of the shielding coil to be described in detail hereinafter. This technique of utilizing the shielding coil for conducting the return current is known per se. The conductor pattern shown in FIG. 4*b* is a faithful representation to scale of the x main gradient coil and the y main gradient coil for use in the field generating superconducting coil system for producing the homogeneous magnetic field in the imaging volume 18 as is also faithfully shown to scale in FIG. 2.

Figure 4C:
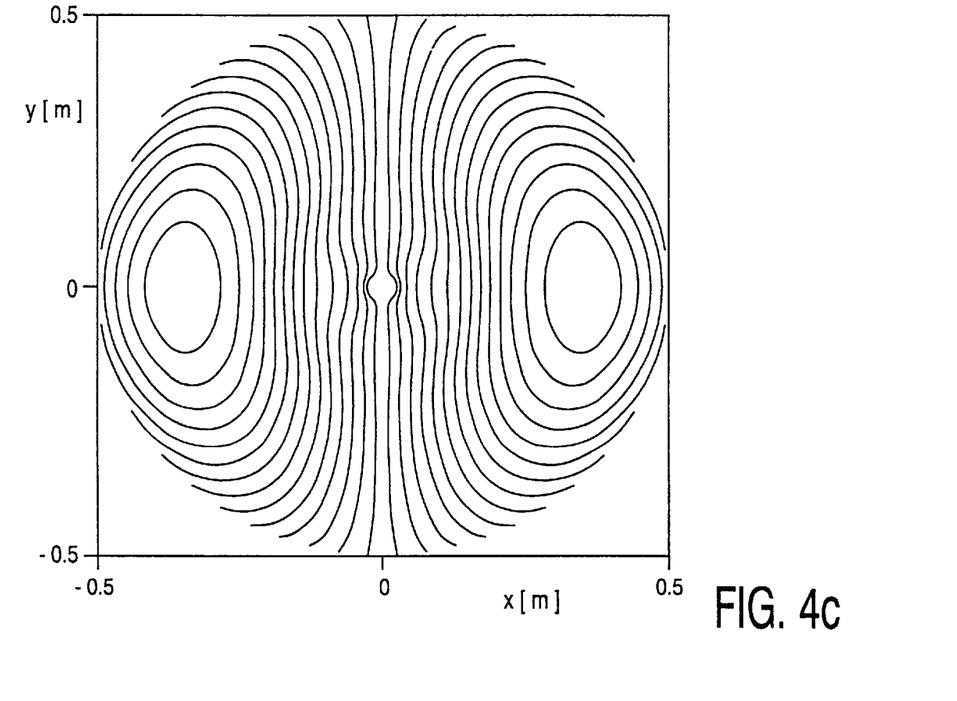
FIG. 4c shows the conductor pattern of the x shielding coil of the gradient coil system in accordance with the invention.

FIG. 4*c* shows the conductor pattern of the x shielding coil of the gradient coil system in accordance with the invention. The appearance of the x shielding coil corresponds in respect of shape to that of the x main gradient coil. The lines in the Figure may again constitute the (series connected) conductors for the gradient current, or the strips between the lines in the Figure may constitute the conductors. In this Figure a number of conductors extending through the center of the Figure again are not closed in themselves. These conductors are connected in series with conductors of the previously described x main gradient coil in order to conduct the return current by way of said conductors. The conductor pattern shown in FIG. 4*c* is a faithful rendition to scale of the x shielding coil and the y shielding coil for use in the field generating superconducting coil system for producing the homogeneous magnetic field in the imaging volume 18 as shown in FIG. 2. However, the conductor pattern according to FIG. 4*c* should still be projected onto a conical surface, parallel to the cone axis, the center of FIG. 4*c* being coincident with the apex of the cone. The apex height of the cone should amount to approximately twice the height of a corresponding gradient coil system with a flat shielding coil parallel to the main gradient coil.

Figure 4D:
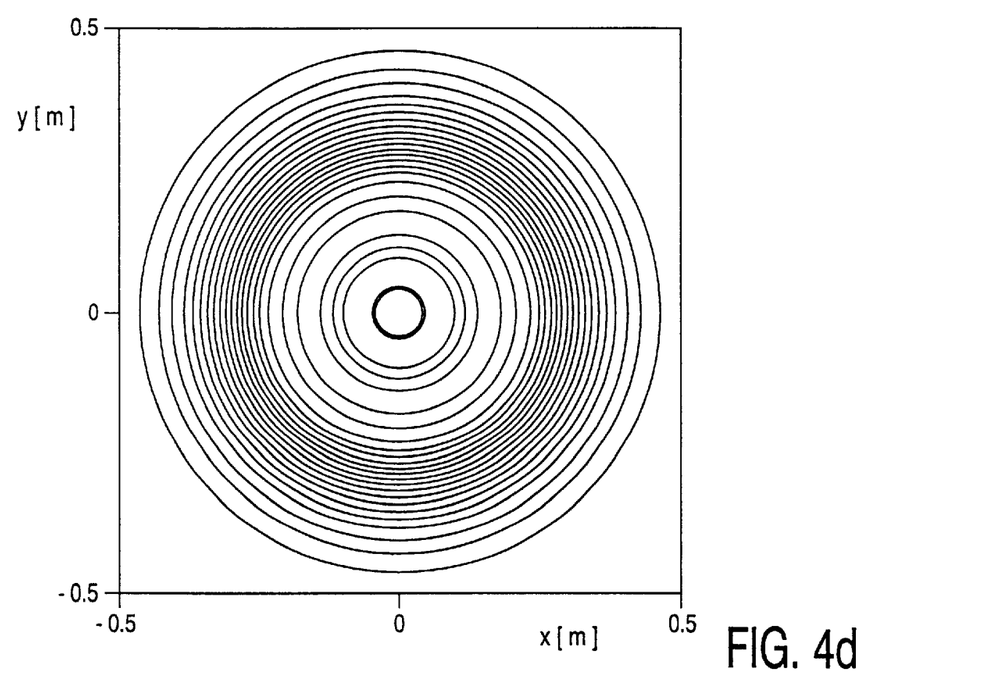
FIG. 4d shows the conductor pattern of the flat z main gradient coil of the gradient coil system in accordance with the invention.

FIG. 4*d* shows the conductor pattern of the flat z main gradient coil of the gradient coil system in accordance with the invention. This coil is formed by a number of concentric circular conductors in a flat plane which are connected in series in a manner that is not shown in the Figure. As for the FIGS. 4*b* and 4*c*, the lines in this Figure may constitute the (series connected) conductors for the gradient current, or the strips between the lines in the Figure may constitute these conductors. The conductor pattern shown in FIG. 4*d* is a faithful rendition to scale of the z main gradient coil for use in the field generating superconducting coil system for producing the homogeneous magnetic field in the imaging volume 18 as shown in FIG. 2.

Figure 4E:
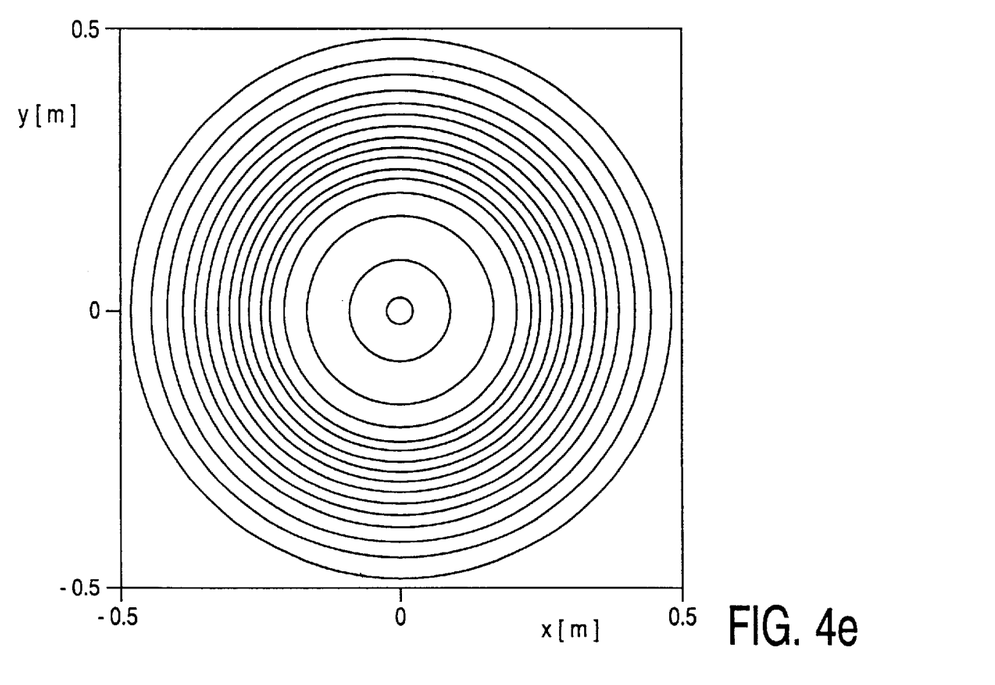
FIG. 4e shows the conductor pattern of the z shielding coil of the gradient coil system in accordance with the invention.

FIG. 4*e* shows the conductor pattern of the (conical) z shielding coil of the gradient coil system in accordance with the invention. Like the flat z main gradient coil, this coil is formed by a number of concentric circular conductors which are connected in series in a manner that is not shown in the Figure. Like in the FIGS. 4*b* to 4*d*, the lines in this Figure may constitute the (series-connected) conductors for the gradient current or the strips between the lines in the Figure may constitute these conductors. The conductor pattern shown in FIG. 4*e* is a faithful rendition to scale of the z shielding coil for use in the field generating superconducting coil system for producing the homogeneous magnetic field in the imaging volume 18 as shown in FIG. 2. However, the conductor pattern according to FIG. 4*e* should still be projected onto a conical surface, parallel to the cone axis, the center of FIG. 4e being coincident with the apex of the cone. The apex height of the cone should amount to approximately twice the height of a corresponding gradient coil system with a flat shielding coil parallel to the main gradient coil.

Figure 4F:
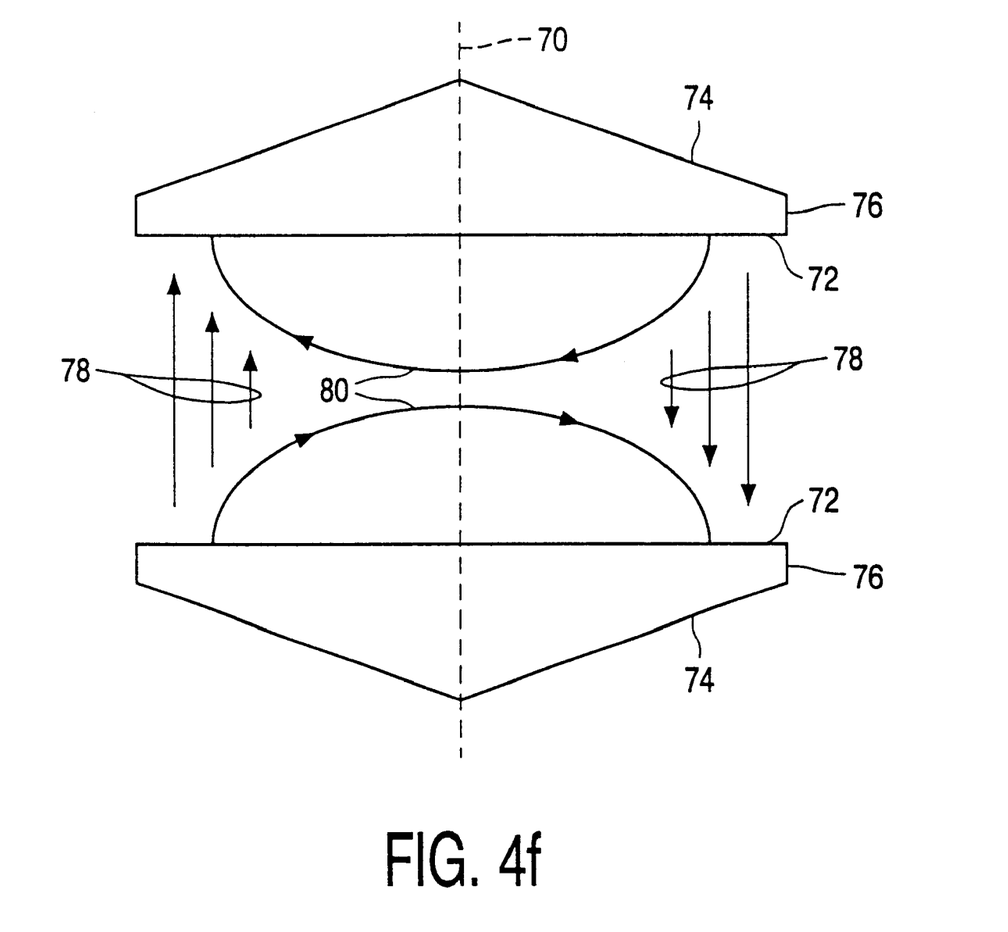
FIG. 4f is a side elevation of an x gradient coil system in accordance with the invention, together with the gradient field generated by this system.

FIG. 4f is a side elevation of an x gradient coil system in accordance with the invention and the gradient field generated by said system. (The same applies to the y gradient coil system.) The straight arrows 78 therein represent the field strength of the gradient field, that is, $\partial B_z/\partial x$, and the curved lines 80 represent the field lines of the gradient field. This Figure clearly illustrates the gradient variation of the field, that is, the variation of the field that is superposed on the magnetic main field and varies linearly as a function of the location in the x direction.

What is claimed is:

1. A vertical field-type MRT apparatus for forming magnetic resonance images, comprising:

at least one field-generating superconducting coil system for producing a substantially homogeneous magnetic field in an imaging volume, said coil system including an outer coil arranged in a flat outer coil plane and a supplementary coil arranged within said outer coil and in said outer coil plane, said outer coil and said supplementary coil being energized to generate magnetic fields in opposite directions, a ratio $D_a/D_o$ of a diameter $D_a$ of said supplementary coil to a diameter $D_o$ of said outer coil being between 0.7 and 0.9; and at least one gradient coil system for producing a magnetic gradient field in the imaging volume, said at least one gradient coil system including a flat main gradient coil and a shielding coil having an apex situated at a distance from said main gradient coil which is larger than a distance between an edge of said shielding coil and said main gradient coil, said at least one gradient coil system being situated at least partly in a space within said supplementary coil.

2. An apparatus as claimed in claim 1, wherein said shielding coil extends across a substantially conical surface.

3. An apparatus as claimed in claim 1, further comprising three additional coils, each of said additional coils being situated in a respective coil plane, said outer coil plane being situated between the imaging volume and each of said coil planes defined by said additional coils.

4. An apparatus as claimed in claim 3, wherein said three additional coils are situated on a conical surface defining an apex directed away from the imaging volume.

5. An apparatus as claimed in claim 1, further comprising:

an additional field-generating superconducting coil system for producing a substantially homogeneous magnetic field in the imaging volume, said additional coil system comprising an outer coil arranged in a flat outer coil plane and a supplementary coil arranged within said outer coil and in said outer coil plane and energized in relation to said outer coil to produce magnetic fields of opposite directions, the ratio $D_a/D_o$ of a diameter $D_a$ of said supplementary coil to a diameter $D_o$ of said outer coil being between 0.7 and 0.9; and an additional gradient coil system for producing a magnetic gradient field in the imaging volume and including a flat main gradient coil and a shielding coil having an apex situated at a distance from said main gradient coil which is larger than the distance between an edge of said shielding coil and said main gradient coil, and said additional gradient coil system being situated at least partly in a space within said supplementary coil of said additional coil system.

6. An apparatus as claimed in claim 5, wherein said shielding coil of said additional gradient coil system extends across a substantially conical surface.

7. An apparatus as claimed in claim 5, further comprising four additional coils, each of said additional coils being situated in a respective coil plane, said outer coil plane defined by said outer coil of said additional coil system being situated between the imaging volume and each of said additional coil planes.

8. An apparatus as claimed in claim 7, wherein said four additional coils are situated on a conical surface having an apex directed away from the imaging volume.

9. An apparatus as claimed in claim 5, wherein said outer coil plane in which said outer coil of said additional coil system is arranged has a diameter larger than a diameter of said outer coil plane in which said outer coil of said at least one coil system is arranged.

10. An apparatus as claimed in claim 1, wherein said at least one coil system is arranged in a respective magnetic pole defining a conical cavity in a central region encompassing the space within said supplementary coil of said at least one coil system.

11. An apparatus as claimed in claim 10, wherein said at least one gradient coil system is arranged entirely in said conical cavity of the respective magnetic pole.

12. An apparatus as claimed in claim 1, wherein the ratio $D_a/D_o$ is 0.8.

13. An apparatus as claimed in claim 1, wherein said main gradient coil is situated substantially in said outer coil plane.

14. An apparatus as claimed in claim 1, wherein said at least one gradient coil system has a flat surface oriented toward the imaging volume and a conical surface oriented away from the imaging volume.

15. An apparatus as claimed in claim 1, wherein said shielding coil detines a conical surface oriented in a direction, away from the imaging volume.

16. A gradient coil system for producing a magnetic gradient field in an imaging volume of an apparatus for forming magnetic resonance images, said gradient coil system comprising:

a main gradient coil wound in a flat plane; and a shielding coil arranged on one side of said main gradient coil and shaped to have an apex situated at a distance from said main gradient coil which is larger than a distance from an edge of said shielding coil to said main gradient coil.

17. A gradient coil system as claimed in claim 16, wherein said shielding coil extends across a substantially conical surface.

18. A gradient coil system as claimed in claim 16, wherein said shielding coil defines a conical surface oriented in a direction away from said main gradient coil.

19. A gradient coil system as claimed in claim 16, further comprising conductors surrounding said main gradient coil.

* * * * *